United States Patent [19]

Yeo

[11] 4,043,033
[45] Aug. 23, 1977

[54] MACHINE FOR INSERTING ELECTRICAL CONTACTS INTO ELECTRICAL INTERCONNECTION BOARDS

[75] Inventor: Herbert G. Yeo, Lincoln, R.I.

[73] Assignee: Augat Inc., Attleboro, Mass.

[21] Appl. No.: 679,174

[22] Filed: Apr. 22, 1976

[51] Int. Cl.² .............................................. H05K 3/30
[52] U.S. Cl. ........................................ 29/739; 29/758; 29/811; 200/61.47; 200/61.52
[58] Field of Search ................ 29/203 B, 203 H, 206, 29/203 HM, 211 R, 626, 739, 758, 811; 200/61.47, 61.52, 182, 153 A; 227/1

[56] References Cited

U.S. PATENT DOCUMENTS

| 3,599,745 | 8/1971 | Hughes | 200/61.47 X |
| 3,772,643 | 11/1973 | Dodd et al. | 200/61.52 X |
| 3,816,895 | 6/1974 | Kuehn et al. | 29/200 P |
| 3,963,456 | 6/1976 | Tsuchiya et al. | 29/203 B |

*Primary Examiner*—Carl E. Hall
*Attorney, Agent, or Firm*—Weingarten, Maxham & Schurgin

[57] ABSTRACT

A machine for inserting socket contacts into holes in electrical panel boards or printed circuit boards. A vibratory feeder is coupled through an escapement by means of a flexible tube to a hand held insertion tool. A timing mechanism operates the escapement at a predetermined rate to individually feed socket contacts to the tool, where they are dispensed into the holes in a panel board. Operation of the timing mechanism can be controlled by a foot switch. The method for insertion is also disclosed.

1 Claim, 7 Drawing Figures

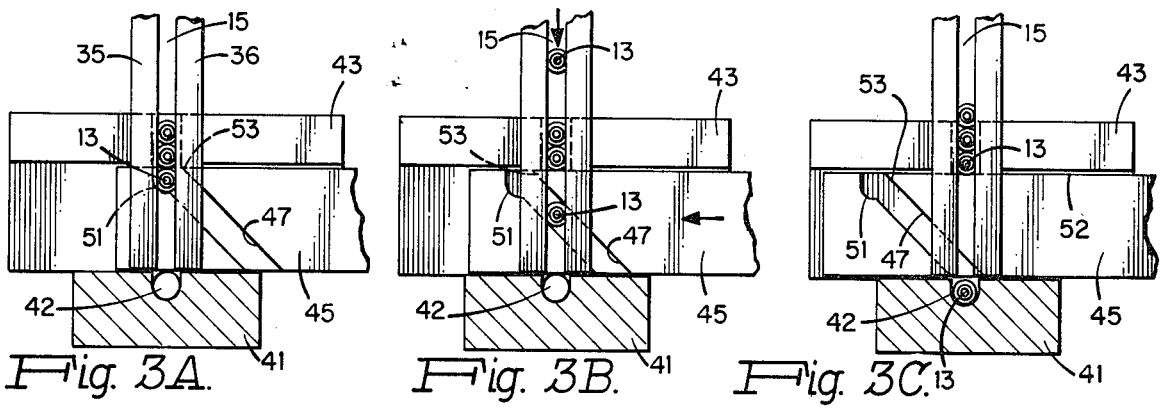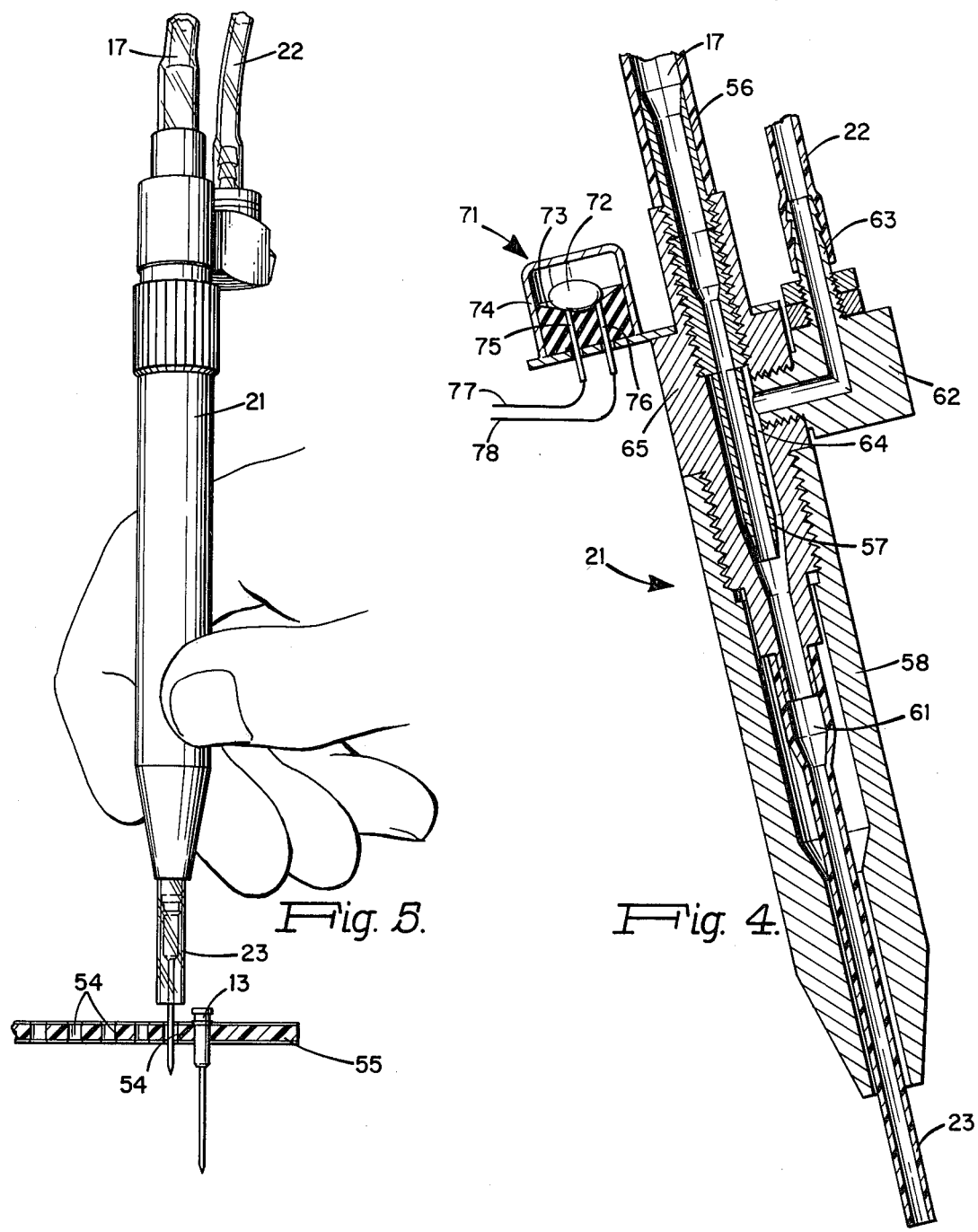

4,043,033

MACHINE FOR INSERTING ELECTRICAL CONTACTS INTO ELECTRICAL INTERCONNECTION BOARDS

FIELD OF THE INVENTION

This invention relates generally to electronic interconnection devices and, more particularly to a tool for mounting socket contacts into arrays of holes in printed circuit boards or panel boards.

DISCUSSION OF THE PRIOR ART

Electrical interconnection boards such as panel boards are typically configured with a multiplicity of regularly arranged, dual-in-line arrays of holes throughout a major portion of their surfaces. A completed panel board normally has a socket contact or other type of electrical contact pin device mounted in each of the holes to facilitate interconnection between electronic components and other portions of the circuitry mounted to the board, as well as to adjacent interconnecting devices and boards. Socket contacts are provided to allow components such as integrated circuit packages, normally having a dual-in-line configuration, to be plugged into the panel board as desire. Printed circuit boards may also have a plurality of dual-in-line arrays of holes but they will likely not be regularly arranged as they are in panel boards. Since they are similar for purposes of this invention, the term panel boards will generally be used herein.

Much electronic equipment, ranging from test equipment to televisions to computers, incorporates one or more of such panel boards, ranging in size from perhaps two inches square to boards which are a foot or more on a side. Many components such as dual-in-line packages and single-in-line packages, as well as sockets or carrier devices for such packages, together with other electronic components, are typically plugged into or otherwise connected to the socket contacts mounted to a panel board.

The normal prior art means for mounting socket contacts into the holes in a panel board is by hand, that is, at work benches or assembly lines where workers with containers full of socket contacts individually place such contacts into the holes in the panel boards. Alternatively, there are automated machines which may insert socket contacts, a full row at a time, two rows at a time, or even more, simultaneously. These machines are very expensive, complicated and require constant operator supervision and maintenance. It may be recognized that while a hand insertion operator may insert approximately fifteen hundred socket contacts per hour into the holes in panel boards, an automated machine is designed to be able to insert as many as twenty thousand contacts per hour, although a lower average number has been more typical in actual operation. It should be pointed out that automated machines cannot tolerate any variation in the boards with which they are to operate, whereas loading the socket pins by hand has the most possible flexibility. Thus, printed circuit boards with the arrays of holes being other than regularly arranged, would not be ideally suited for automatic machine insertion of socket contacts. Another problem with automated machines is that the possibility exists that, due to a minor malfunction, one or more holes in an array may not have a contact inserted therein, and careful inspection and hand insertion is necessary after the machine has completed its operation.

SUMMARY OF THE INVENTION

Broadly speaking, this invention relates to a tool with which an operator may significantly increase his rate of insertion of electrical contacts, such as socket contacts, into holes in printed circuit or panel boards, while retaining the flexibility accompanying the previous manual insertion method. This invention enables an operator to function at an intermediate level between hand insertion and automated insertion of contacts, permitting the operator to work at the rate of four to eight thousand insertions per hour.

The invention comprises a feeding device such as a vibratory bowl feeder from the exit point of which a slot leads to an escapement mechanism which is operated by a timing mechanism. The timing mechanism may be set a variable predetermined rates to individually feed socket contacts through the escapement mechanism. Coupled to the escapement is a flexible tube, at the end of which is a hand held insertion tool having an exhaust port or nozzle which the operator moves from hole to hole in the board as the contacts are fed through the nozzle. The contacts are urged through the tube into the hand tool by means of compressed air which is coupled to the hand tool to form a jet pump arrangement. The same source of air may be used to operate the escapement mechanism.

BRIEF DESCRIPTION OF THE DRAWING

The objects, advantages and features of the present invention will be more clearly understood from the following detailed description when read in conjunction with the accompanying drawing in which:

FIGS. 3A-3C are section views taken along cutting plane 3—3 of FIG. 2 showing the sequence of operation of the escapement mechanism;

FIG. 4 is a sectional view of the hand held tool showing the safety switch and the jet pump apparatus; and FIG. 5 is an enlarged view of the tool being used in conjunction with a panel board for insertion of electrical contacts.

DESCRIPTION OF THE PREFERRED EMBODIMENTS

Figure 1:
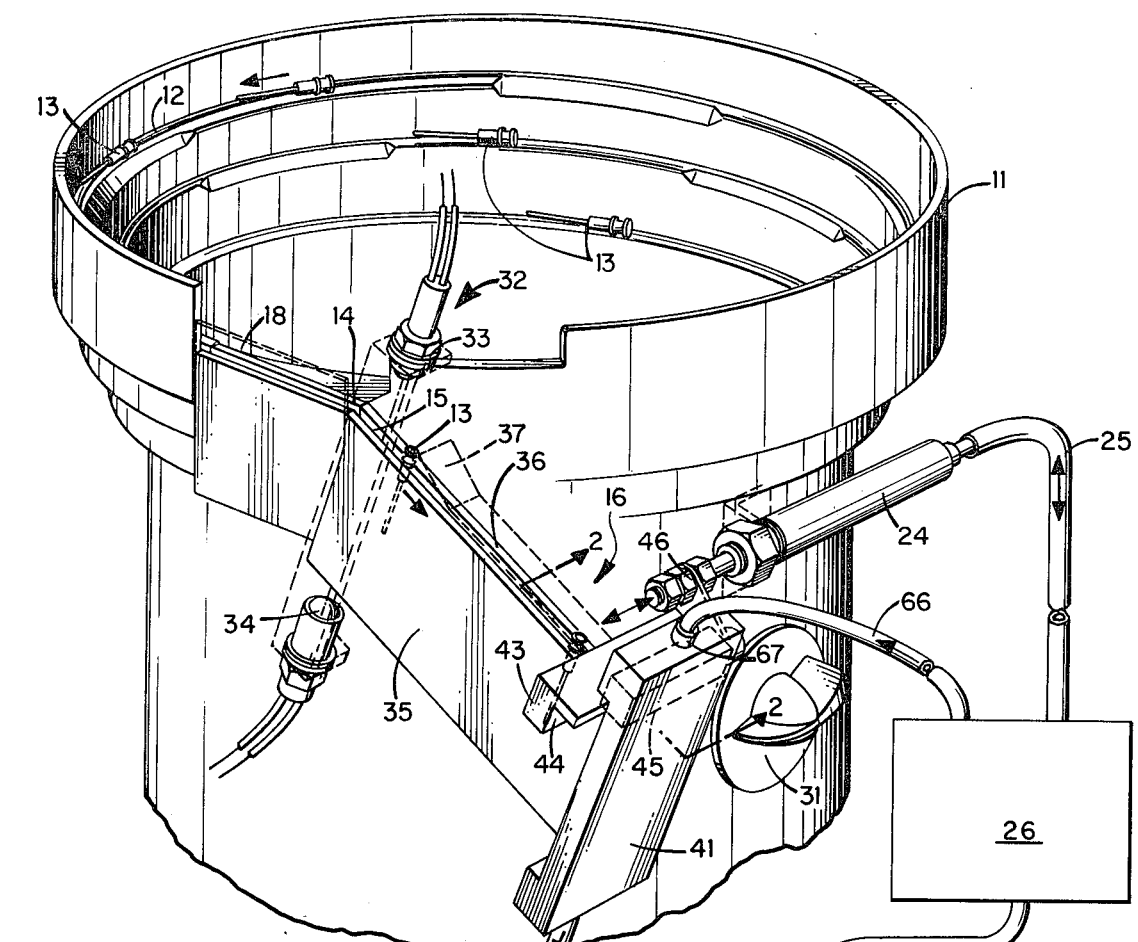
FIG. 1 is a perspective view of the mechanism constructed in accordance with the present invention.

With reference now to the drawing and more particularly to FIG. 1 thereof, there is shown a conventional vibratory bowl feeder 11 having a spiral ramp 12. The bowl feeder holds a large number of contacts 13 and feeds them in tandem fashion along the spiral ramp. Any other small parts feeding device could also be used in place of bowl feeder 11. At the end of spiral ramp 12 is a slot 14 leading to slotted track 15 which slopes down and away from the top of bowl feeder 11. At the end of track 15 is escapement mechanism 16 to which is attached flexible tube 17. At the end of tube 17 is insertion tool 21 to which is connected air supply line 22. A baffle 18 on the outside of slot 15 prevents contacts from riding along the top of the slot and falling out of the feeder.

Socket contacts 13 travel up spiral ramp 12 in conventional manner, pass in an upright orientation through slot 14 into track 15, individually through escapement mechanism 16 and tube 17 whereupon they are discharged from tool 21 through nozzle 23. The socket contacts as shown are known devices having a longitudinal contact pin at one end and a socket opening into the other end. The socket is so configured as to frictionally engage electrical component leads inserted therein. However, any type of elongated electrically conductive contact adapted to be mounted in standard fashion in a panel or printed circuit board may be used.

Escapement mechanism 16 is operated by piston 24 to which is connected air hose 25. Schematic control block 26 incorporates the timing mechanism, as well as the source of compressed air, both of conventional construction. The timing mechanism, most likely an electrical switching device, is turned off and on by means of foot pedal 27 in a manner well known in the prior art. The speed at which bowl 11 operates is governed by continuously variable control 31.

In order to prevent track 15 from being overloaded and possibly causing it to jam with respect to the escapement mechanism, a detector 32 may be provided at the top end of the track near the transition point between slot 14 and track 15. This detector mechanism is comprised of a light source 33 and a photodetector 34. When rack 15 is filled with contacts 13, the light beam will be interrupted and turn off the bowl feeder in known manner until the last contact in the track moves down the line toward the escapement mechanism. Alternatively, a simple spillback system may be used where contacts fall back into the feeder when the track and slot are full. Track 15 is comprised of two flat plates 35 and 36 and the space between these plates is open from top to bottom so that the use of detecting mechanism 32 is facilitated. On top of track 15 is guide member 37, depicted in FIG. 1 in phantom form, so as not to interfere with a clear view of the other elements of the structure. The socket end of contact 13 is substantially larger in diameter than is the contact pin. At one point on the external surface of the socket contact adjacent the socket end is an annular shoulder which supports the contact along the top surface of track 15 with the contact pin end extending down into the track between plates 35 and 36. It may be possible that a pin may ride up in the track above its normal position and guide 37 assures that these pins are in proper position when approaching escapement mechanism 16. The guide member can move up and down within certain limits and it operates to keep the contacts in place primarily by means of gravity.

Figure 2:
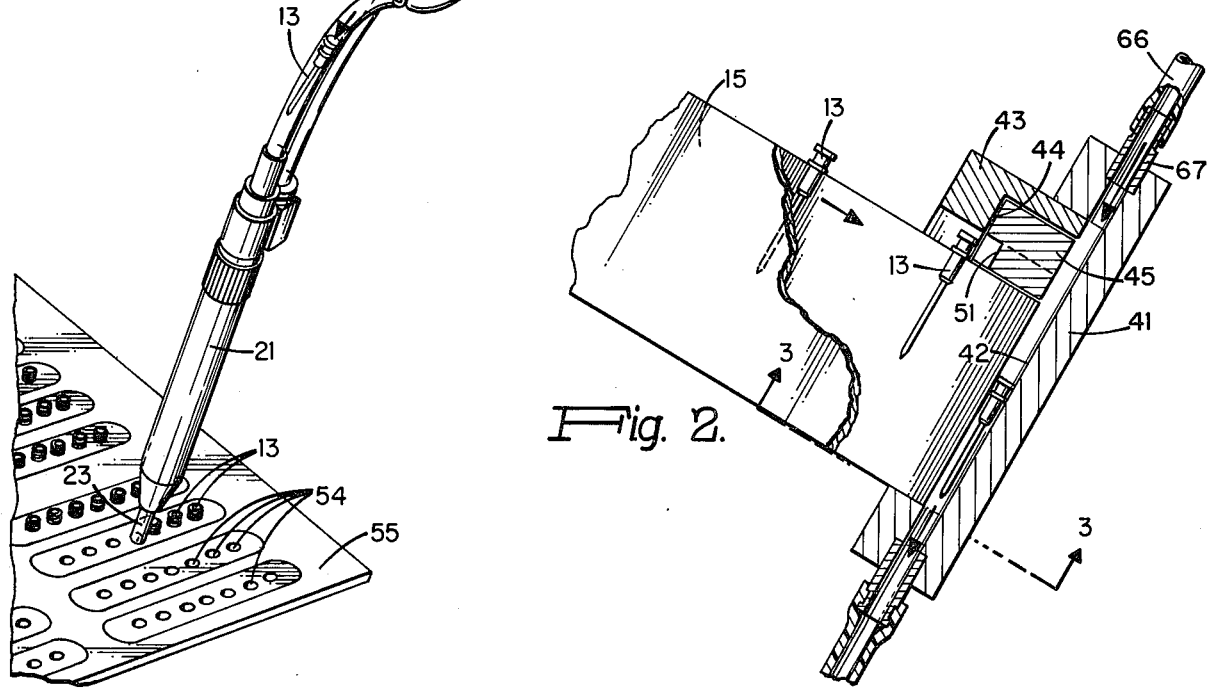
FIG. 2 is a partial sectional view through the escapement mechanism taken along cutting plane 2—2 of FIG. 1.

The escapement mechanism is shown in detail in FIGS. 2 and 3. End plate 41 is mounted at the lower end of track 15 on plates 35 and 36, and is formed with a generally vertically oriented hole 42 which essentially forms the termination of track 15. Guide 43 is mounted to end plate 41 on top of plates 35 and 36 and is formed with guideway 44 in which shuttle 45 resides. Shuttle 45 is coupled to plunger 24 (FIG. 1) by means of coupling 46 and operates on a back and forth sliding cycle for each contact to be fed. Shuttle 45 is formed with diagonal groove 47, formed in the bottom surface thereof communicating with the top of track 15. Groove 47 has an enlarged opening 51 at the upper end where the contact enters from track 15. In the quiescent condition, shuttle 45 is normally in the position shown in FIG. 3C, with socket contact 13 resting against upper surface 52 facing track 15 and the bowl feeder. A socket contact 13 is shown approaching this position in FIG. 2. At the start of a cycle, shuttle 45 moves to the right, as shown in FIG. 3A, and the contact moves into enlarged opening 51 at the end of groove 47. As the shuttle moves leftward, point 53 at the intersection of groove 47 and surface 52 cuts off the next socket contact in line in slot 15 and the contact which entered enlarged portion 51 of groove 47 moves down the continuation of slot 15 as it continues to intersect with groove 47, as shown in FIGS. 3B and 3C. At the end of the leftward travel of the shuttle, the contact moves out of track 15 and slot 47 into hole 42 in end plate 41 and then travels rapidly down tube 17 into insertion tool 21 and out through nozzle 23 into hole 54 in panel board 55 (see FIG. 1). With reference to FIG. 3 it may be seen that the shuttle may reside either fully left or fully right as its quiescent condition because in either event a contact would not be permitted to travel the remainder of the length of slot 15 into hole 42 in end plate 41 until the shuttle moves to the left from its extreme right position.

Insertion tool 21 is shown in detail in FIGS. 4 and 5. Flexible tube 17 is coupled to the tool by means of a nipple 56 which has a nozzle 57 projecting into the interior of body 58 of the insertion tool. The passageway for contacts 13 extends from tube 17 through nipple 56, nozzle 57, longitudinal axial opening 61 in body 58 and, finally, through exhaust nozzle 23. Air hose 22 is attached to coupling 62 appended to tool 21 by means of nipple 63. The passageway for the air is conducted from the hose through coupling 62 to annular passageway 64 between nozzle 57 and tool end cap 65. From this point the air can only exhaust through nozzle 23, through the same path as is followed by contact 13, thereby creating a vacuum in nozzle 57 within body 58. This vacuum draws contacts rapidly from escapement mechanism 16 through tube 17 and tool 21 to exhaust through nozzle 23 into board 55. The passageway from the escapement mechanism through tool 21 and nozzle 23 is only slightly larger than contact 13 so that the vacuum can be effective. However, the passageway is sufficiently large so as to allow air to escape if the tool is not properly aimed in such a manner as to permit the ejected contact to immediately enter a hole in the panel board. This feature permits the operator to catch up without jamming the machine when temporarily falling behind the machine pace. All he need do is release the foot switch and feed the contacts which are in the tool, then resume normal operation.

It is contemplated that the air supplied through hose 22 will be constant and that the air supplied through hose 25 to piston 24 will be pulsating to operate the escapement mechanism in regular cyclical fashion. By way of example, a timing circuit in control 26 may be used to generate electrical pulses which are converted to air pulses to operate plunger 24. This combination of actions will feed contacts individually at a predetermined but adjustable rate through the insertion tool as positioned by the operator (see FIG. 5). A simple control, similar to control 31 on feeder 11, may be employed on control 26 to vary the rate of operation of the escapement mechanism. The connections between hand tool body 58, cap 65 and coupling 62, together with the other elements thereof, may be made in any convenient manner, and the method of mounting these elements together is not germane to this invention.

To facilitate positive feeding of the socket contacts, air may also be fed constantly through hose 66 to coupling 67 at the top of hole 42 in end plate 41. This will act in conjunction with the vacuum formed in tool 21 by hose 22 coupled as described above. Either supply of forced air could be adequate to feed the contacts. As an alternative to using the hand held tool 21, the air supplied by hose 66 could be used to force the contacts through tube 17 directly into the panel board holes. That is, a continuous flexible tube could take the place of tool 21 to adequately feed the electrical contacts.

A safety switch 71 is shown in FIG. 4. To prevent tool 21 from being raised to a horizontal position or above where feeding of contacts could be dangerous, switch 71 is mounted to the hand tool. The tool is normally intended to operate in a substantially vertical orientation. Mercury 72 rests in cone 73 within housing 74 and provides electrical connection between contacts 75 and 76 in the normal vertical position. If the tool is tilted such that one or both contacts is not touched by the pool of mercury, the circuit is broken and the feeding mechanism stops. Wires 77 and 78 could be connected to the timing mechanism in control 26 to effect this safety feature. The angle at which switch 71 operates would typically range between roughly 30° and 45°.

Although not shown, the mechanism described may be modified to have more than one feeding track 15 and a multiple escapement mechanism. This would permit one feeder to supply more than one insertion tool simultaneously, or a single insertion tool could be made with a dual head to feed two contacts at the same time. Other conbinations and permutations could be constructed which would merely be modifications of the present invention.

In view of the above description and drawing, it is likely that modifications and improvements will occur to those skilled in this art which are within the scope of this invention.

What is claimed is:

1. Safety means in combination with a machine for inserting elongated electrical contacts into holes in electrical interconnection boards, said machine comprising; means for holding a multiplicity of said contacts, means for feeding said contacts in tandem fashion from said holding means, means extending from said feeding means for arranging a plurality of said contacts in at least one closely adjacent row, escapement means mounted to said arranging means, insertion means having an exhaust nozzle, said insertion means normally operating in a vertical orientation, means for flexibly connecting said insertion means to said escapement means, said escapement means removing said contacts individually from said arranging means and feeding them to said insertion means through said flexible connecting means, and means for controlling the operation of said escapement means to eject said contacts individually from said exhaust nozzle at a predetermined rate, wherein said safety means comprises:

a safety switch mounted to said insertion means and operatively connected to said controlling means to stop operation of said escapement means when said insertion means is tilted at a predetermined angle with respect to the vertical, said switch comprising:

a housing having a top and walls extending therefrom forming a cup shaped enclosure;

a receptacle having a concave configuration within said housing, said concave surface of said receptacle extending outwardly to intersect the interior walls of said housing thereby forming a closed cavity between the interior surfaces of said top and sides of said housing and the concave surface of said receptacle;

a pair of contacts terminating substantially at the concave surface of said receptacle and extending externally of said switch;

wires for connecting said contacts to said controlling means; and a pool of mercury residing at all times within said cavity and normally in said receptacle, said mercury normally bridging and electrically interconnecting both of said contacts when said insertion tool is in an upright orientation, said mercury moving out of engagement with at least one of said contacts when said insertion tool is tilted to between 30° and 45° with respect to the vertical, thereby opening the circuit to said controlling means and stopping the operation of said escapement means, said mercury returning freely to its operative position bridging said contacts when said insertion tool is returned to normal position within 30° to 45° with respect to the vertical.

* * * * *